(12) United States Patent
Koizumi

(10) Patent No.: US 11,313,884 B2
(45) Date of Patent: Apr. 26, 2022

(54) CURRENT SENSOR

(71) Applicant: AISIN CORPORATION, Kariya (JP)

(72) Inventor: Nozomi Koizumi, Kariya (JP)

(73) Assignee: AISIN CORPORATION, Kariya (JP)

( * ) Notice: Subject to any disclaimer, the term of this patent is extended or adjusted under 35 U.S.C. 154(b) by 82 days.

(21) Appl. No.: 16/817,170

(22) Filed: Mar. 12, 2020

(65) Prior Publication Data

US 2021/0080489 A1    Mar. 18, 2021

(30) Foreign Application Priority Data

Sep. 12, 2019    (JP) .............................. JP2019-166015

(51) Int. Cl.
*G01R 15/14* (2006.01)
*G01D 5/14* (2006.01)
*G01R 15/20* (2006.01)

(52) U.S. Cl.
CPC ........... *G01R 15/148* (2013.01); *G01D 5/145* (2013.01); *G01R 15/207* (2013.01)

(58) Field of Classification Search
CPC ..... G01R 15/148; G01R 15/207; G01D 5/145
See application file for complete search history.

(56) References Cited

U.S. PATENT DOCUMENTS

| | | | |
|---|---|---|---|
| 7,626,376 B2 * | 12/2009 | Muraki | B82Y 25/00 324/117 H |
| 9,164,132 B2 * | 10/2015 | Okumura | G01R 15/207 |
| 9,310,394 B2 | 4/2016 | Okumura et al. | |
| 9,784,769 B2 | 10/2017 | Miyakoshi et al. | |
| 9,880,206 B2 * | 1/2018 | Akimoto | G01R 33/093 |
| 11,035,888 B2 * | 6/2021 | Umetsu | G01R 1/04 |
| 2019/0277890 A1 | 9/2019 | Esaka et al. | |

FOREIGN PATENT DOCUMENTS

| | | |
|---|---|---|
| JP | 2013142569 A | 7/2013 |
| JP | 2016099320 A | 5/2016 |
| JP | 2018096794 A | 6/2018 |
| JP | 6379451 B2 | 8/2018 |
| JP | 2018185230 A | 11/2018 |

\* cited by examiner

*Primary Examiner* — Reena Aurora
(74) *Attorney, Agent, or Firm* — Buchanan Ingersoll & Rooney PC

(57) ABSTRACT

A current sensor includes at least two conductors and at least two magnetoelectric conversion units each having at least two magnetism detection elements for detecting magnetic flux density of magnetic flux input to detection surfaces facing the same direction, and outputting a signal according to a difference in magnetic flux density between orthogonal components orthogonal to the detection surface of magnetic flux input to the detection surface of the magnetism detection elements. Each conductor includes an extending portion extending along a second-direction orthogonal to a first-direction being an adjacent direction of two adjacent conductors, and a recessed portion including orthogonal portions extending along a third-direction orthogonal to the first- and second-directions and recessed in the third-direction from the extending portion. Each magnetoelectric conversion unit is disposed with the detection surface facing the orthogonal portion of the recessed portion.

11 Claims, 4 Drawing Sheets

CURRENT SENSOR

CROSS REFERENCE TO RELATED APPLICATIONS

This application is based on and claims priority under 35 U.S.C. § 119 to Japanese Patent Application 2019-166015, filed on Sep. 12, 2019, the entire content of which is incorporated herein by reference.

TECHNICAL FIELD

This disclosure generally relates to a current sensor for detecting current flowing through a conductor.

BACKGROUND DISCUSSION

Conventionally, a technology in which, when current flowing through a conductor is measured, magnetic flux density of a magnetic field generated around the conductor according to current flowing through the conductor is detected by using a magnetism detection element and, based on the detected magnetic flux density, current applied to the conductor is acquired through calculation has been used. Examples of a current sensor using such a technology include, for example, current sensors described in JP2016-99320A (Reference 1), JP2018-96794A (Reference 2), and JP2013-142569A (Reference 3).

In Reference 1, a current sensor for measuring current flowing through a conductor is disclosed. The current sensor is constituted of a U-shaped core made of a magnetic material, a conductor inserted into a slit of the core, and a detection element being arranged in the slit of the core and detecting a magnetic field.

In Reference 2, a coreless current sensor is disclosed that detects a magnetic field generated from a current path and converts the detected magnetic field to an electrical signal and thereby detects current flowing through the current path and that does not require a magnetism collecting core. The current sensor includes three bus bars, and, to each bus bar, a magnetism detection element is arranged so as to face the bus bar. In order to shield the magnetism detection element against a magnetic field from outside, a pair of a first magnetism shield and a second magnetism shield are disposed so as to sandwich the bus bar and the magnetism detection element. By adjusting at least one of a distance between two first magnetism shields adjacent to each other and a distance between two second magnetism shields adjacent to each other, influence of a leakage magnetic field from a bus bar to which one magnetism detection element among two magnetism detection elements adjacent to each other is disposed, on the other magnetism detection element, is reduced.

In Reference 3, a current sensor for measuring a value of current to be measured, based on an induced magnetic field induced by the current to be measured is disclosed. The current sensor is constituted of a path of current to be measured through which current to be measured flows, a magnetic sensing element that is arranged on the path of current to be measured and has a main sensitivity axis aligned with a direction of induced magnetic field induced by the current to be measured and a sensitivity influencing axis orthogonal to the main sensitivity axis, and a neighboring current path that extends in parallel with the path of current to be measured and is arranged on an extension line of the main sensitivity axis. The magnetic sensing element is disposed in such a way that a direction of the main sensitivity axis and a direction of the sensitivity influencing axis are respectively orthogonal to a direction of an induced magnetic field induced by neighboring current flowing through the neighboring current path.

In the technology described in Reference 1, since a core made of a magnetic material is arranged so as to surround a conductor, a size of the current sensor is determined by a size of the core, and miniaturization of the current sensor is difficult. In the technology described in Reference 2, configuring the current sensor without disposing a magnetism collecting core enables a length of the first magnetism shield, the magnetism detection element, the bus bar, and the second magnetism shield in a direction along a stacking direction thereof to be reduced. However, since the current sensor is configured in such a way that the first magnetism shield and the second magnetism shield sandwich the magnetism detection element and the bus bar, there is room for improvement in miniaturization of the device. Further, in the technology described in Reference 2, in order to prevent the first magnetism shield and the second magnetism shield from being magnetically saturated, it is required to increase sizes of the first magnetism shield and the second magnetism shield or to arrange the first magnetism shield and the second magnetism shield at locations further apart from the bus bar as current (a current value) to be detected increases. For this reason, there is also room for improvement in miniaturization of the device in this respect. Although the technology described in Reference 3 is configured in such a way that influence of a magnetic field from a neighboring current path is reduced by an appropriate arrangement of the path of current to be measured, for example, measuring a value of current flowing through the neighboring current path is not considered.

A need thus exists for a current sensor which is not susceptible to the drawback mentioned above.

SUMMARY

A current sensor according to this disclosure includes at least two conductors and at least two magnetoelectric conversion units to each of which at least two magnetism detection elements including detection surfaces facing the same direction as each other with respect to the conductors, and detecting magnetic flux density of magnetic flux input to the detection surfaces are disposed, and each of which outputs a signal according to a difference in the magnetic flux density between orthogonal components orthogonal to the detection surface of the magnetic flux input to the detection surface of each of the at least two magnetism detection elements. To each of the at least two conductors, an extending portion extending along a second direction orthogonal to a first direction being an adjacent direction of two conductors adjacent to each other, and a recessed portion including orthogonal portions extending along a third direction orthogonal to both the first direction and the second direction and being recessed in the third direction with respect to the extending portion are disposed. Each of the at least two magnetoelectric conversion units is disposed with the detection surface facing each of the orthogonal portions of the recessed portion.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

A current sensor according to this disclosure is configured in a compact manner without using a core. Hereinafter, a current sensor 1 of this embodiment will be described. When current flows through a conductor, a magnetic field is generated about the conductor as an axis according to the amount of the current (Ampere's right-handed screw rule). The current sensor 1 detects magnetic flux density of magnetic flux in such a magnetic field and measures current (a current value) flowing through the conductor, based on the detected magnetic flux density.

Figure 1:
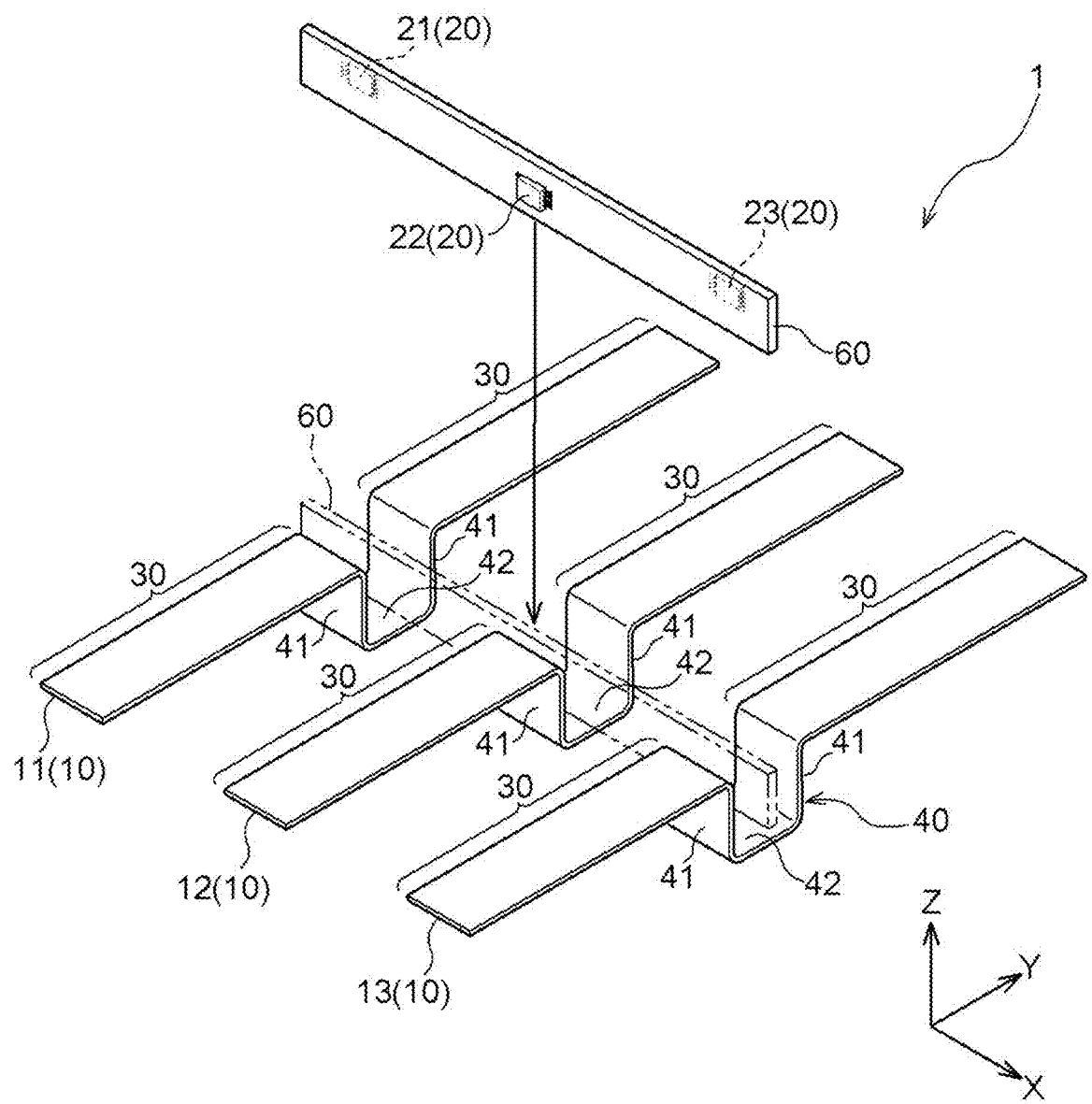
FIG. 1 is a developed view of a current sensor.
Figure 2:
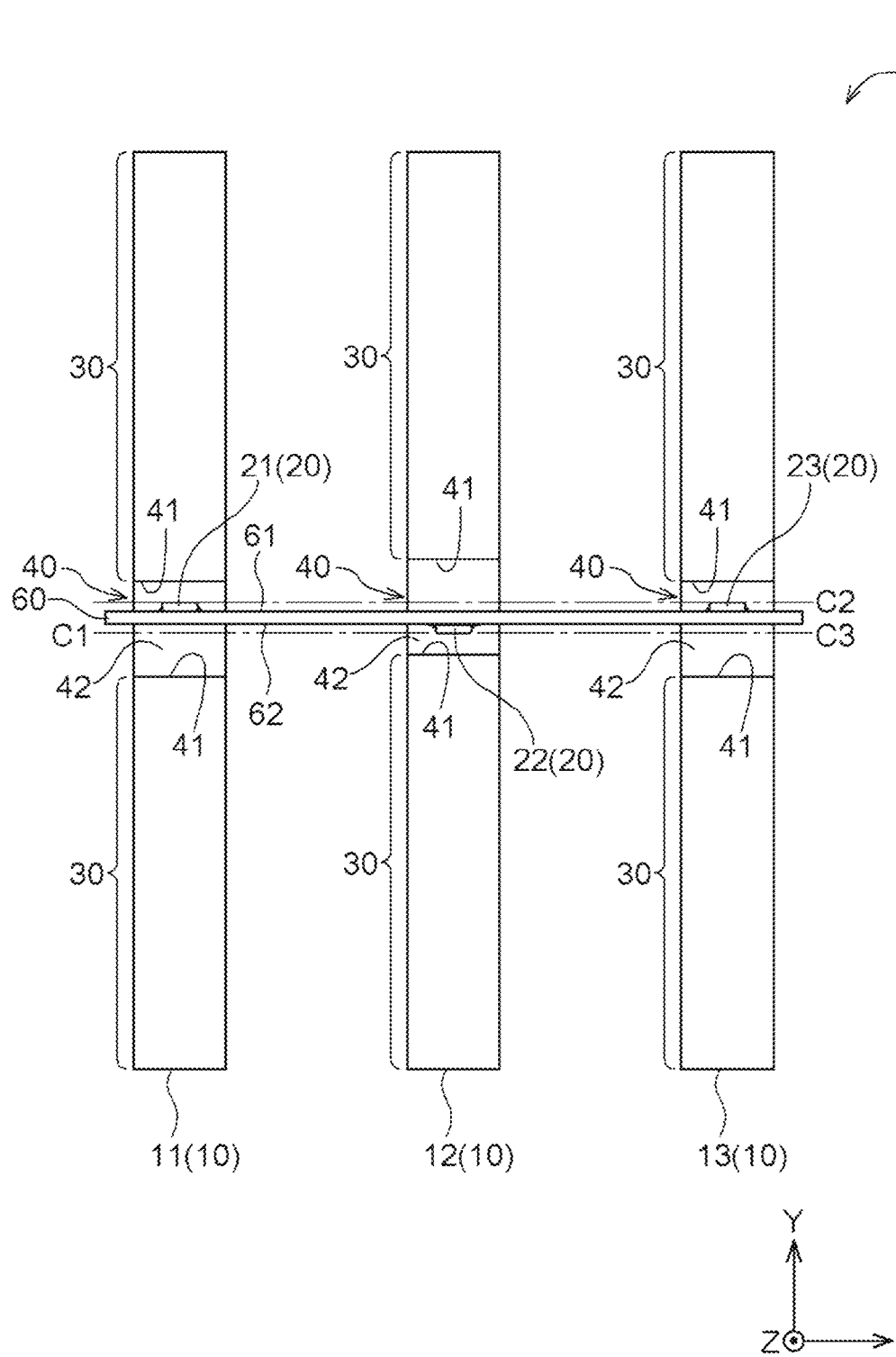
FIG. 2 is a plan view of the current sensor.
Figure 3:
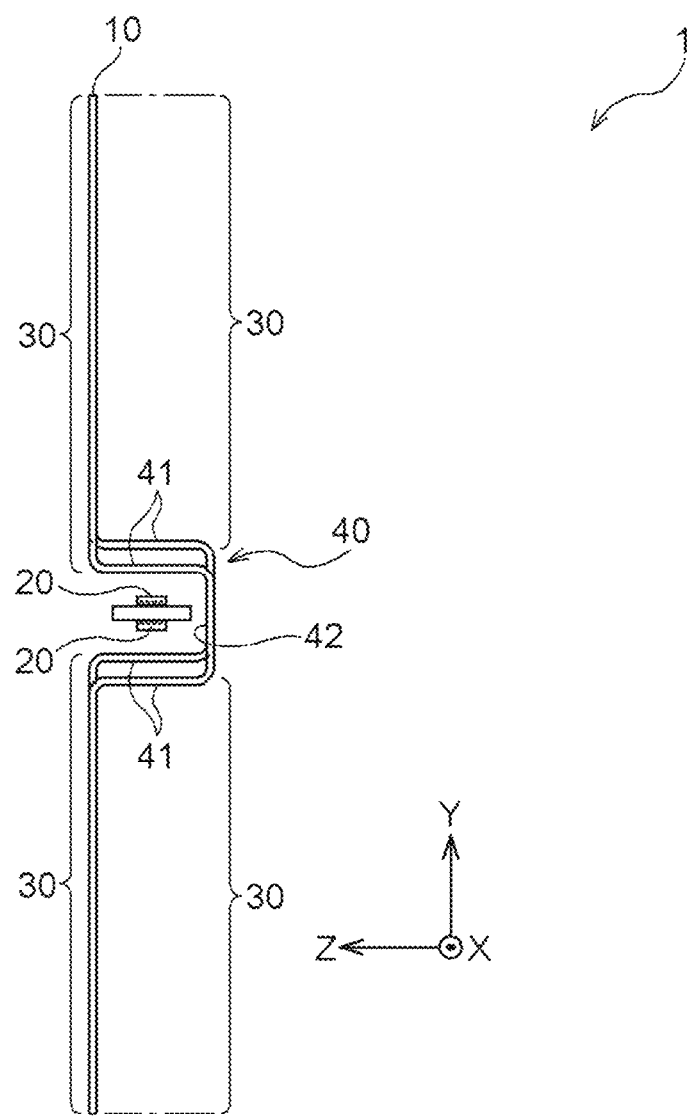
FIG. 3 is a side view of the current sensor.

FIGS. 1, 2, and 3 are a developed view, a plan view, and a side view, respectively, of the current sensor 1. The current sensor 1 is constituted of at least two conductors 10 and at least two magnetoelectric conversion units 20.

This embodiment will be described assuming that the at least two conductors 10 are three bus bars connected to a three-phase motor. More specifically, each of the conductors 10 electrically connects one of the three terminals of the three-phase motor to one of the three terminals of an inverter that controls current flowing through the three-phase motor. For this reason, the following description will be made assuming that the at least two conductors 10 are three conductors 10 and, when discriminating the three conductors 10 from one another, the three conductors 10 are a conductor 11, a conductor 12, and a conductor 13.

To each of the three conductors 10, extending portions 30 and a recessed portion 40 are disposed. Each extending portion 30 extends along a second direction orthogonal to a first direction that is an adjacent direction of two conductors 10 adjacent to each other. The two conductors 10 adjacent to each other are two conductors 10, namely the conductor 11 and the conductor 12, which are adjacent to each other, or two conductors 10, namely the conductor 12 and the conductor 13, which are adjacent to each other. A direction in which the conductor 11 and the conductor 12 are adjacent to each other and a direction in which the conductor 12 and the conductor 13 are adjacent to each other are examples of the adjacent direction, and the X-direction in FIGS. 1 to 3 corresponds to the adjacent direction.

In this embodiment, the adjacent direction as described above is referred to as a first direction. The second direction is a direction orthogonal to the first direction, and the Y-direction in FIGS. 1 to 3 corresponds to the second direction. Therefore, portions extending along the Y-direction of each of the conductors 10 correspond to the extending portions 30.

Each recessed portion 40 includes orthogonal portions 41 that extend along a third direction orthogonal to both the first direction and the second direction and is formed into a shape that is recessed in the third direction with respect to the extending portions 30. In this embodiment, the first direction and the second direction are the X-direction and the Y-direction, respectively. Thus, to the third direction, which is orthogonal to both the first direction and the second direction, the Z-direction in FIGS. 1 to 3 corresponds. The recessed portion 40 has the orthogonal portions 41 disposed so as to extend along the Z-direction described above. Therefore, the extending portions 30 and the orthogonal portions 41 are formed orthogonal to each other as illustrated in FIG. 3, and the recessed portion 40 is formed to have a shape recessed in the Z-direction from the extending portions 30 via the orthogonal portions 41.

In this embodiment, each of the recessed portions 40 is formed into, when viewed in the X-direction, a letter U shape (in this embodiment, a shape having two corner portions on the bottom side, which is the opposite side to the opening portion of the letter U shape) as illustrated in FIG. 3. Therefore, in this embodiment, one recessed portion 40 is constituted of two orthogonal portions 41 facing each other and one bottom portion 42 sandwiched by the two orthogonal portions 41.

In this embodiment, the conductor 11, the conductor 12, and the conductor 13 are disposed in such a way that the extending portions 30 of the respective conductors are lined up in a row along the first direction, as illustrated in FIGS. 1 to 3. Being lined up in a row along the first direction means that the extending portions 30 of the respective conductors are lined up so as to be in parallel with one another and have portions overlapping one another when viewed in the X-direction.

Each of the at least two magnetoelectric conversion units 20 is disposed to one of the conductors 10. In this embodiment, the conductors 10 are constituted of three conductors, namely the conductor 11, the conductor 12, and the conductor 13. Since the magnetoelectric conversion units 20 are individually disposed to the respective conductors 10, that is, the conductor 11, the conductor 12, and the conductor 13, the current sensor 1 includes three magnetoelectric conversion units 20. Thus, the following description will be made assuming that the at least two magnetoelectric conversion units 20 are three magnetoelectric conversion units 20 and, when discriminating the three magnetoelectric conversion units 20 from one another, the three magnetoelectric conversion units 20 are a magnetoelectric conversion unit 21 corresponding to the conductor 11, a magnetoelectric conversion unit 22 corresponding to the conductor 12, and a magnetoelectric conversion unit 23 corresponding to the conductor 13.

Figure 4:
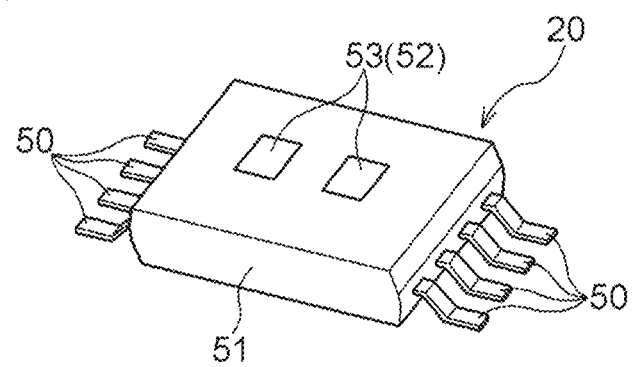
FIG. 4 is a diagram illustrating detection surfaces of a magnetoelectric conversion unit.

In this embodiment, to each of the magnetoelectric conversion units 20, two magnetism detection elements 52 are disposed. Each of the magnetism detection elements 52 is a device having a function of detecting magnetic flux density of magnetic flux, and, for example, a Hall element applies to the magnetism detection element 52. In this embodiment, each of the magnetoelectric conversion units 20 is configured containing two magnetism detection elements 52 in a resin package 51 having a plurality of electrodes 50, as illustrated in FIG. 4.

Each of the two magnetism detection elements 52 has a detection surface 53 through which magnetic flux having a magnetic flux density, which is a detection target described above, is input. The two magnetism detection elements 52 are arranged in such a way that both detection surfaces 53 thereof face in the same direction. Note that a detection surface 53 in this embodiment does not indicate a surface in a space but simply indicates a functional portion configured to detect magnetic flux density, that is, a detection portion. Therefore, the same description applies even when a detection surface 53 is replaced with a detection portion.

When current flows through each of the conductors 10, a magnetic field is generated centered around the conductor 10 according to the amount of the current. The magnetism detection elements 52 detect magnetic flux density of magnetic flux in such a magnetic field. In addition, each of the three magnetoelectric conversion units 20 is disposed with the detection surfaces 53 thereof facing the orthogonal portions 41 of one of the recessed portions 40, as illustrated in FIGS. 1 to 3. Specifically, each of the three magnetoelectric conversion units 20 is arranged in such a way that the two detection surfaces 53 thereof are positioned in line along the first direction and distances from the respective ones of the two detection surfaces 53 to an orthogonal portion 41 that the detection surfaces 53 face are equal to each other. For example, when current in a direction illustrated by an arrow in FIG. 5 flows through one of the conductors 10, magnetic flux in a direction illustrated by a dashed line is generated at an orthogonal portion 41 facing a magnetoelectric conversion unit 20. For this reason, to the detection surface 53 of one magnetism detection element 52 of the two magnetism detection elements 52, magnetic flux in a direction directed from the orthogonal portion 41 toward the detection surface 53 is input, and, to the detection surface 53 of the other magnetism detection element 52 of the two magnetism detection elements 52, magnetic flux in a direction directed from the detection surface 53 toward the orthogonal portion 41 is input.

The two magnetism detection elements 52 detect magnetic flux density of orthogonal components orthogonal to the detection surfaces 53 of the magnetic flux input to the respective detection surfaces 53 of the two magnetism detection elements 52. That is, the two magnetism detection elements 52 detect magnetic flux density of magnetic flux in the directions along the Y-direction in FIG. 5.

Figure 5:
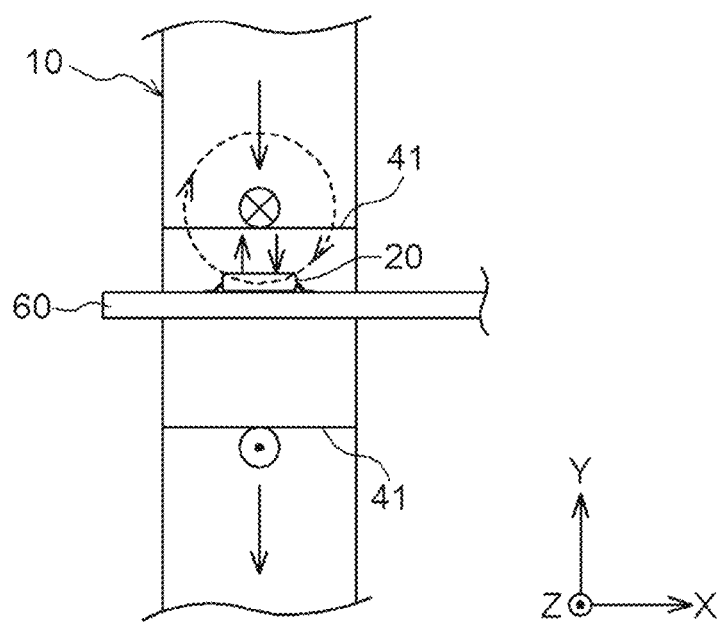
FIG. 5 is a diagram illustrating an example of magnetic flux density input to the detection surfaces.
Figure 6:
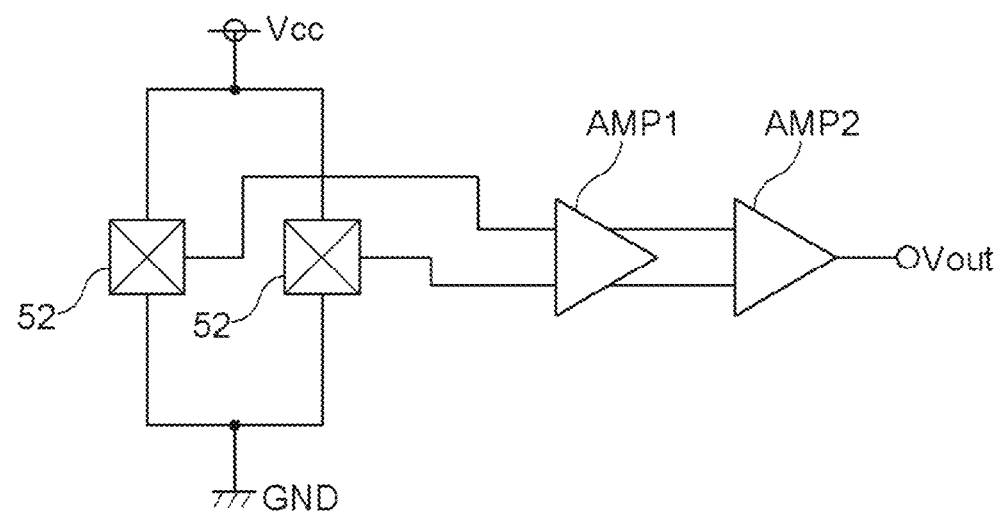
FIG. 6 is a block diagram of the magnetoelectric conversion unit.

In this embodiment, as illustrated in FIG. 5, the directions of orthogonal components of magnetic flux that are input to the respective detection surfaces 53 of the two magnetism detection elements 52 are opposite to each other. Thus, each of the magnetoelectric conversion units 20 is configured to output a signal according to a difference in magnetic flux density between the orthogonal components of magnetic flux input to the two detection surfaces 53. Specifically, in each of the magnetoelectric conversion units 20, two magnetism detection elements 52 are wired as illustrated in FIG. 6. That is, respective detection results from the two magnetism detection elements 52 are input to the inverting terminal and non-inverting terminal of an amplifier AMP1, and differential magnetic flux is detected by the amplifier AMP1. Further, the differential magnetic flux is amplified by an amplifier AMP2 at the succeeding stage, and the amplified differential magnetic flux is output as a signal from the magnetoelectric conversion unit 20. This configuration enables the magnetoelectric conversion unit 20 to detect magnetic flux density of magnetic flux generated caused by current flowing through the orthogonal portion 41.

In addition, in this embodiment, each of the magnetoelectric conversion units 20 is disposed with the detection surfaces 53 thereof offset to the side on which an orthogonal portion 41 is located of the middle portion in a direction along the second direction of the recessed portion 40. The detection surfaces 53 are surfaces through which magnetic flux having a magnetic flux density, which is a detection target of the magnetism detection elements 52 with which each of the magnetoelectric conversion units 20 is provided, is input. The middle portion in a direction along the second direction of the recessed portion 40 is the middle portion in the Y-direction of the recessed portion 40 and is equivalent to the middle portion between a pair of orthogonal portions 41 that the recessed portion 40 has and that face each other. In this embodiment, since one recessed portion 40 has a pair of orthogonal portions 41, being offset to the side on which an orthogonal portion 41 is located means being closer to one than the other of the pair of orthogonal portions 41.

In this embodiment, when it is assumed that, in the three recessed portions 40 illustrated in FIG. 2, the orthogonal portions 41 on the upper side of the plane of paper are located on one side and the orthogonal portions 41 on the lower side of the plane of paper are located on the other side, in the conductor 11, the magnetoelectric conversion unit 21 (two detection surfaces 53) is disposed offset to the side on which an orthogonal portion 41 on the one side is located so as to face the orthogonal portion 41 on the one side. In the conductor 12, the magnetoelectric conversion unit 22 (two detection surfaces 53) is disposed offset to the side on which an orthogonal portion 41 on the other side is located so as to face the orthogonal portion 41 on the other side, and, in the conductor 13, the magnetoelectric conversion unit 23 (two detection surfaces 53) is disposed offset to the side on which an orthogonal portion 41 on the one side is located so as to face the orthogonal portion 41 on the one side.

A magnetoelectric conversion unit 20 disposed in the recessed portion 40 of one of two conductors 10 that are adjacent to each other is disposed at a position on an extension line extending along the first direction from the middle portion of the recessed portion 40 of the other of the two conductors 10. In addition, a magnetoelectric conversion unit 20 disposed in the recessed portion 40 of the other of the two conductors 10 that are adjacent to each other is disposed at a position on an extension line extending along the first direction from the middle portion of the recessed portion 40 of the one of the two conductors 10. The two conductors 10 that are adjacent to each other are two conductors 10, namely the conductor 11 and the conductor 12, or two conductors 10, namely the conductor 12 and the conductor 13.

Therefore, when it is assumed that two conductors 10 that are adjacent to each other are the conductor (first conductor) 11 and the conductor (second conductor) 12, the magnetoelectric conversion unit (first magnetoelectric conversion unit) 21, which is disposed in the recessed portion (first recessed portion) 40 of the conductor 11, is disposed at a position on an extension line C2 extending along the X-direction from the middle portion in the Y-direction of the recessed portion (second recessed portion) 40 of the conductor 12, and the magnetoelectric conversion unit (second magnetoelectric conversion unit) 22, which is disposed in the recessed portion 40 of the conductor 12, is disposed at a position on an extension line C1 extending along the X-direction from the middle portion in the Y-direction of the recessed portion 40 of the conductor 11, as illustrated in FIG. 2.

Similarly, when it is assumed that two conductors 10 that are adjacent to each other are the conductor 12 and the conductor (third conductor) 13, the magnetoelectric conversion unit (second magnetoelectric conversion unit) 22, which is disposed in the recessed portion 40 of the conductor 12, is disposed at a position on an extension line C3 extending along the X-direction from the middle portion in the Y-direction of the recessed portion 40 (third recessed portion) of the conductor 13, and the magnetoelectric conversion unit (third magnetoelectric conversion unit) 23, which is disposed in the recessed portion 40 of the conductor 13, is disposed at a position on the extension line C2 extending along the X-direction from the middle portion in the Y-direction of the recessed portion 40 of the conductor 12.

Therefore, in this embodiment, when the conductor 11 and the conductor 13 are disposed along the Y-direction in parallel with each other, the magnetoelectric conversion unit 21, which is disposed in the recessed portion 40 of the conductor 11, and the magnetoelectric conversion unit 23, which is disposed in the recessed portion 40 of the conductor 13, are disposed lined up in a row along the X-direction, as illustrated in FIG. 2. As a result, as illustrated in FIG. 3, the recessed portion 40 of the conductor 13 and the recessed portion 40 of the conductor 12 are shifted from each other in the second direction when viewed in the first direction, and the recessed portion 40 of the conductor 13 and the recessed portion 40 of the conductor 11 overlap each other when viewed in the first direction.

In this embodiment, since, for example, the detection surfaces 53 of the respective ones of the two magnetism detection elements 52 in the magnetoelectric conversion unit 22 of the conductor 12 are positioned on the extension line C1, at which magnetic fields generated by the respective ones of the two orthogonal portions 41 of the conductor 11, which face each other, cancel each other, the magnetoelectric conversion unit 22 is not influenced by the magnetic fields generated by the conductor 11 when the magnetoelectric conversion unit 22 measures a current value of current flowing through the conductor 12. Similarly, the magnetoelectric conversion unit 21 is not influenced by magnetic fields generated by the conductor 12. In addition, similarly, the magnetoelectric conversion unit 23 is not influenced by magnetic fields generated by the conductor 12, and the magnetoelectric conversion unit 22 is not influenced by magnetic fields generated by the conductor 13.

Thus, it is suitable that two magnetoelectric conversion units 20 that are disposed in the respective ones of the recessed portions 40 of two conductors 10 adjacent to each other be mounted on the surfaces different from each other of a sheet of substrate 60.

That is, when it is assumed that two conductors 10 that are adjacent to each other are the conductor 11 and the conductor 12, the magnetoelectric conversion unit 21, which is disposed in the recessed portion 40 of the conductor 11, is mounted on one surface 61 of the substrate 60, and the magnetoelectric conversion unit 22, which is disposed in the recessed portion 40 of the conductor 12, is mounted on the other surface 62 of the substrate 60. Similarly, when it is assumed that two conductors 10 that are adjacent to each other are the conductor 12 and the conductor 13, the magnetoelectric conversion unit 23, which is disposed in the recessed portion 40 of the conductor 13, is mounted on the one surface 61 of the substrate 60, and the magnetoelectric conversion unit 22, which is disposed in the recessed portion 40 of the conductor 12, is mounted on the other surface 62 of the substrate 60.

As described above, according to the current sensor 1 of this disclosure, mounting the magnetoelectric conversion units 20, which are disposed in the respective ones of the recessed portions 40 of the three conductors 10, on the sheet of substrate 60 enables the magnetoelectric conversion units 20 to be easily positioned with respect to the recessed portions 40 and to be arranged at expected positions. In addition, since the current sensor 1 can be constituted of the conductors 10 and the magnetoelectric conversion units 20, it becomes possible to miniaturize the current sensor 1.

Other Embodiments

Although, in the above-described embodiment, the description was made using as an example a case where the number of the conductors 10 is three, the number of the conductors 10 may be two or four or more. In any case, the current sensor 1 is capable of detecting current flowing through the conductors 10 without including a magnetic material core.

Although, in the above-described embodiment, the description was made assuming that each of the magnetoelectric conversion units 20 is disposed with the detection surfaces 53 thereof offset to the side on which an orthogonal portion 41 is located of the middle portion in a direction along the second direction of a recessed portion 40, each of the magnetoelectric conversion units 20 can be disposed with the detection surfaces 53 thereof located at the middle portion in the direction along the second direction of the recessed portion 40.

Although, in the above-described embodiment, the description was made assuming that the magnetoelectric conversion unit 20 disposed in one of the recessed portions 40 of two conductors 10 that are adjacent to each other is disposed at a position on an extension line extending along the first direction from the middle portion of the other of the recessed portions 40 of the two conductors 10, the current sensor 1 can also be configured without disposing the magnetoelectric conversion unit 20 disposed in one of the recessed portions 40 of the two conductors 10 adjacent to each other at a position on an extension line extending along the first direction from the middle portion of the other of the recessed portions 40 of the two conductors 10.

Although, in the above-described embodiment, the description was made assuming that two magnetoelectric conversion units 20 disposed in the respective ones of the recessed portions 40 of two conductors 10 that are adjacent to each other are mounted on the surfaces different from each other on the sheet of substrate 60, the two magnetoelectric conversion units 20 disposed in the respective ones of the recessed portions 40 of the two conductors 10 adjacent to each other can be mounted on substrates different from each other or mounted on the same surface on the sheet of substrate 60.

Although, in the above-described embodiment, the description was made using as an example a case where the at least two conductors 10 are three bus bars connected to a three-phase motor, the at least two conductors 10 may be conductors other than three bus bars connected to a three-phase motor. In addition, when the at least two conductors 10 are three bus bars connected to a three-phase motor, the three bus bars do not have to be configured in such a way that the extending portions 30 are lined up in a row along the first direction.

Although, in the above-described embodiment, a case where the magnetoelectric conversion units 20 are mounted on the substrate 60 was used, the substrate 60 can also be used in conjunction with a substrate on which a control IC for controlling drive of the three-phase motor is mounted.

Although, in the above-described embodiment, the description was made assuming that each of the recessed portions 40 is formed into, when viewed in the X-direction, a letter U shape having two corner portions on the bottom side, which is the opposite side to the opening portion of the letter U shape, the recessed portion 40 may be formed into, when viewed in the X-direction, a letter U shape the bottom side of which curves.

Although, in the above-described embodiment, the description was made assuming that, to each of the magnetoelectric conversion units 20, two magnetism detection elements 52 are disposed, it is preferable that, to each of the magnetoelectric conversion units 20, at least two magnetism detection elements 52 be disposed. That is, three or more magnetism detection elements 52 may be disposed to each of the magnetoelectric conversion units 20, and, in such a case, each of the magnetoelectric conversion units 20 preferably output a signal according to a difference in magnetic flux density among orthogonal components orthogonal to the detection surfaces 53 of the magnetic flux input to the detection surfaces 53 of the respective ones of at least two magnetism detection elements 52 (that is, the respective ones of all the magnetism detection elements 52 disposed to each of the magnetoelectric conversion units 20).

This disclosure can be used for a current sensor configured to detect current flowing through conductors.

A current sensor according to this disclosure includes at least two conductors and at least two magnetoelectric conversion units to each of which at least two magnetism detection elements including detection surfaces facing the same direction as each other with respect to the conductors, and detecting magnetic flux density of magnetic flux input to the detection surfaces are disposed, and each of which outputs a signal according to a difference in the magnetic flux density between orthogonal components orthogonal to the detection surface of the magnetic flux input to the detection surface of each of the at least two magnetism detection elements. To each of the at least two conductors, an extending portion extending along a second direction orthogonal to a first direction being an adjacent direction of two conductors adjacent to each other, and a recessed portion including orthogonal portions extending along a third direction orthogonal to both the first direction and the second direction and being recessed in the third direction with respect to the extending portion are disposed. Each of the at least two magnetoelectric conversion units is disposed with the detection surface facing each of the orthogonal portions of the recessed portion.

Since such a feature and configuration make a magnetism collecting core and a shield core unnecessary and enables a current sensor to be constituted of conductors and magnetoelectric conversion units, it becomes possible to miniaturize a current sensor for detecting current flowing through each of a plurality of conductors.

In the current sensor described above, each of the magnetoelectric conversion units may be disposed with the detection surface being offset to a side of one of the orthogonal portions from a middle portion in a direction along the second direction of the recessed portion, and the magnetoelectric conversion unit disposed in the recessed portion of one of the two conductors adjacent to each other may be disposed at a position on an extension line extending along the first direction from the middle portion of the recessed portion of the other of the two conductors.

Such a configuration enables disturbance to a conductor being a detection target being caused by another conductor adjacent to the conductor to be canceled out. Therefore, it becomes possible to detect magnetic flux density with high precision.

In the current sensor described above, two of the magnetoelectric conversion units disposed in the respective recessed portions of the two conductors adjacent to each other may be mounted on surfaces different from each other of one substrate.

Such a configuration enables positioning of the magnetoelectric conversion unit in each of a plurality of the recessed portions to be performed on the basis of one surface and the other surface of one substrate. Therefore, it becomes possible to, while minimizing the number of used substrates, easily arrange the magnetoelectric conversion unit at an expected position in each of a plurality of the recessed portions.

In the current sensor described above, the at least two conductors may be three bus bars connected to a three-phase motor and the three bus bars may have the extending portions lined up in a row along the first direction.

Such a configuration enables three-phase current flowing through a three-phase motor to be detected with a small-sized current sensor.

In the current sensor described above, when two conductors adjacent to each other are defined as a first conductor and a second conductor, a first magnetoelectric conversion unit disposed in a first recessed portion of the first conductor may be disposed at a position on a second extension line extending along the first direction from a middle portion in a direction along the second direction of a second recessed portion of the second conductor, and a second magnetoelectric conversion unit disposed in the second recessed portion of the second conductor may be disposed at a position on a first extension line extending along the first direction from a middle portion in a direction along the second direction of the first recessed portion of the first conductor.

In the current sensor described above, when two conductors adjacent to each other are defined as a second conductor and a third conductor, a second magnetoelectric conversion unit disposed in a second recessed portion of the second conductor may be disposed at a position on a third extension line extending along the first direction from a middle portion in a direction along the second direction of a third recessed portion of the third conductor, and a third magnetoelectric conversion unit disposed in the third recessed portion of the third conductor may be disposed at a position on a second extension line extending along the first direction from a middle portion in a direction along the second direction of the second recessed portion of the second conductor.

In the current sensor described above, the third recessed portion and the second recessed portion may be shifted from each other in the second direction when viewed in the first direction and the third recessed portion and the first recessed portion may overlap each other when viewed in the first direction The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. A current sensor comprising:
    at least two conductors, two of the at least two conductors being adjacent to each other in an adjacent direction; and
    at least two magnetoelectric conversion units, each of the at least two magnetoelectric conversion units disposed with at least two magnetism detection elements that include detection surfaces facing a same direction as each other with respect to the conductors, and that detect magnetic flux density of magnetic flux input to the detection surfaces, and each of the at least two magnetoelectric conversion units configured to output a signal according to a difference in the magnetic flux density between orthogonal components orthogonal to the detection surface of the magnetic flux input to the detection surface of each of the at least two magnetism detection elements, wherein, each of the at least two conductors includes an extending portion extending along a second direction orthogonal to a first direction being the adjacent direction, and a recessed portion including orthogonal portions extending along a third direction orthogonal to both the first direction and the second direction, and being recessed in the third direction with respect to the extending portion, and each of the at least two magnetoelectric conversion units is disposed with the detection surfaces facing the orthogonal portions of the recessed portion.

2. The current sensor according to claim 1, wherein
each of the magnetoelectric conversion units is disposed with the detection surface being offset to a side of one of the orthogonal portions from a middle portion in a direction along the second direction of the recessed portion, and the magnetoelectric conversion unit disposed in the recessed portion of one of the two conductors adjacent to each other is disposed at a position on an extension line extending along the first direction from the middle portion of the recessed portion of another of the two conductors.

3. The current sensor according to claim 2, wherein two of the magnetoelectric conversion units disposed in the respective recessed portions of the two conductors adjacent to each other are mounted on surfaces different from each other of one substrate.

4. The current sensor according to claim 3, wherein the at least two conductors are three bus bars connected to a three-phase motor, and the three bus bars have the extending portions lined up in a row along the first direction.

5. The current sensor according to claim 2, wherein the at least two conductors are three bus bars connected to a three-phase motor, and the three bus bars have the extending portions lined up in a row along the first direction.

6. The current sensor according to claim 1, wherein two of the magnetoelectric conversion units disposed in the respective recessed portions of the two conductors adjacent to each other are mounted on surfaces different from each other of one substrate.

7. The current sensor according to claim 6, wherein the at least two conductors are three bus bars connected to a three-phase motor, and the three bus bars have the extending portions lined up in a row along the first direction.

8. The current sensor according to claim 1, wherein the at least two conductors are three bus bars connected to a three-phase motor, and the three bus bars have the extending portions lined up in a row along the first direction.

9. The current sensor according to claim 1, wherein,
when two conductors adjacent to each other are defined as a first conductor and a second conductor, a first magnetoelectric conversion unit disposed in a first recessed portion of the first conductor is disposed at a position on a second extension line extending along the first direction from a middle portion in a direction along the second direction of a second recessed portion of the second conductor, and a second magnetoelectric conversion unit disposed in the second recessed portion of the second conductor is disposed at a position on a first extension line extending along the first direction from a middle portion in a direction along the second direction of the first recessed portion of the first conductor.

10. The current sensor according to claim 1, wherein,
when two conductors adjacent to each other are defined as a second conductor and a third conductor, a second magnetoelectric conversion unit disposed in a second recessed portion of the second conductor is disposed at a position on a third extension line extending along the first direction from a middle portion in a direction along the second direction of a third recessed portion of the third conductor, and a third magnetoelectric conversion unit disposed in the third recessed portion of the third conductor is disposed at a position on a second extension line extending along the first direction from a middle portion in a direction along the second direction of the second recessed portion of the second conductor.

11. The current sensor according to claim 10, wherein the third recessed portion and the second recessed portion are shifted from each other in the second direction when viewed in the first direction, and the third recessed portion and the first recessed portion overlap each other when viewed in the first direction.

* * * * *